April 17, 1962 E. H. BORNEMAN ETAL 3,030,559

USE OF PRINTED CIRCUIT BOARD FOR HALL GENERATORS

Filed May 15, 1959

WITNESSES

Edwin E. Bassler

Charles L. Menzemer

INVENTORS
Edmond H. Borneman &
Alfred Meyerhoff
BY
Frederick Shapoe
ATTORNEY

United States Patent Office 3,030,559

Patented Apr. 17, 1962

3,030,559

USE OF PRINTED CIRCUIT BOARD FOR HALL GENERATORS

Edmond H. Borneman, Jeannette, and Alfred Meyerhoff, Greensburg, Pa., assignors to Westinghouse Electric Corporation, East Pittsburgh, Pa., a corporation of Pennsylvania Filed May 15, 1959, Ser. No. 813,433
4 Claims. (Cl. 317—234)

This invention relates generally to Hall generators and more specifically to a method of manufacturing Hall generator devices suitable for measuring electrical quantities.

In preparation of Hall generator devices and their subsequent installation in electrical measuring apparatus, for example, watt-hour meters, the attachment of the primary and secondary contacts or terminals to the thin slice of semiconductive material has presented many problems well known to those skilled in the art.

An object of the present invention is to provide an improved method of preparing and mounting Hall generator type semiconductor devices comprising mounting a thin wafer of a semiconductive material on a printed circuit board which contains all the necessary contacts or terminals for the slice as an integral part thereof.

Another object of the invention is to provide a Hall generator device comprising an insulating board, a plurality of printed circuit members thereon, a wafer of a semiconductor material connected to the circuit members, and a coating of electrical insulating material applied to the board, circuit members and the wafer.

Other objects will, in part, be obvious and will, in part, appear hereinafter.

For a better understanding of the nature and objects of the present invention, reference should be had to the following detailed description and drawings, in which.

It will be understood that FIGS. 1 to 6 are greatly enlarged for the purpose of clarity.

In accordance with the present invention and attainment of the foregoing objects, there is provided a Hall generator semiconductor device comprising, a fully cured resinous member, at least two electrical conducting metal contacts disposed in a predetermined position upon one surface of said resinous member, and a slice of a semiconductive material disposed upon said one surface in association with said contacts and electrically joined to said contacts.

In accordance with another aspect of the present invention, there is provided a device suitable for measuring electrical quantities comprising a Hall generator which generator comprises a thin slice of a semiconductive material mounted in a predetermined position on a printed circuit board, the printed circuit board comprising primary current input terminals at one pair of opposite edges of the slice, secondary current terminals at the other pair of opposite edges of the slice on a line at right angles to the line joining the input terminals.

Figure 1:
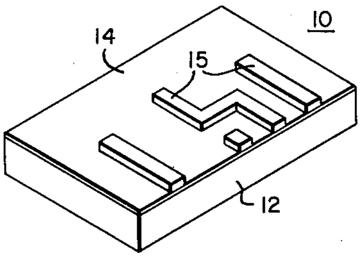
FIG. 1 is a view in perspective of a fully cured resin laminate with a metal foil clad to one side thereof and a coating of a resist on the upper face suitable for use in accordance with the teachings of this invention.

More specifically and with reference to FIG. 1, there is illustrated a metal-clad board 10 of an insulating material. The board 10 is comprised of a sheet of insulating material such as a fully cured resin laminate 12 and a layer of a metal foil 14 adherently attached thereto, and a resist 15 applied in a desired circuit pattern corresponding to suitable terminals or contacts.

Sheet 12 may be comprised of any suitable resin, for example phenolformaldehyde, melamineformaldehyde, ureaformaldehyde, siloxane, polyester, epoxy, silicone rubber, nylon, polytetrafluoroethylene, trifluorochloroethylene and mixtures thereof. The resin may also be comprised of from 5% to 80%, by weight, of a filler or a fabric, for example, asbestos fibers, glass fibers loose, woven or knitted, wood flour, clay, silica, mica powder and flakes, wollastonite and the like. Also the sheet 12 may be a ceramic plate such as zircon porcelain or steatite.

The layer of metal foil 14 may be comprised of any suitable electrically conducting metal, metal mixtures, or alloy, for example copper, aluminum, silver, tin, bronze, steel, tin coated copper and the like.

Figure 2:
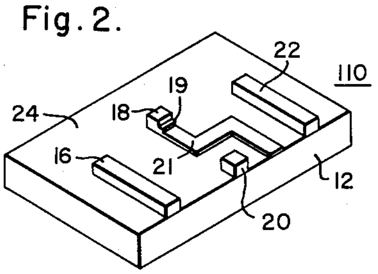
FIG. 2 is a view in perspective of the metal clad resin laminate of FIG. 1 with some of the metal cladding removed in accordance with the teachings of this invention.

A predetermined electrical circuit pattern 15 is produced upon the metal foil 14 by applying a coating of a resist comprising an acid resistant resin, using a stencil or other methods known in the art, for example by the photoengraving process, or the silk screen process. A printed circuit board 110, as illustrated in FIG. 2, is produced from the board 10 of FIG. 1 by etching away the portion of the foil which is not coated by the resist 15. The process by which the printed circuit board 110 is produced could be produced by other methods including pressing conductors directly on the insulating material, and other known processes for producing printed circuit members.

The circuit upon printed circuit board 110 is in relief and is comprised of the unetched portions of the metal of foil 14 of FIG. 1. The circuit is comprised of contacts or terminals 16, 18, 20 and 22. Terminals 16 and 22 are primary input terminals. Terminals 18 and 20 are secondary terminals. Terminals 16, 18, 20 and 22 are normally in relief with portion 21 of terminal 18 extending a lesser distance above surface 24 of board 110 than the rest of the terminal or the other terminals for reasons which will be come obvious from the discussion that follows herein.

Thus, the portion 21 can be selectively etched to remove about half its thickness, or the portion 21 can be pressed into board 12, if it is a resin, in a press, leaving an edge 19 projecting above 21.

Figure 3:
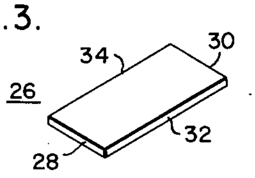
FIG. 3 is a view in perspective of a thin slice of a semiconductive material suitable for use in accordance with the teachings of this invention.

With reference to FIG. 3, there is illustrated a thin slice of a semiconductive material 26, for example silicon, germanium, and essentially stoichiometric compounds of elements from groups III and V of the periodic table, aluminum, gallium and indium, and arsenic, antimony and phosphorous, indium antimonide, indium arsenide, indium antimonide-indium phosphide, and gallium arsenide. The slice 26 is of rectangular configuration with one pair of opposite edges 28 and 30 and another pair of edges 32 and 34 at right angle thereto.

Figure 4:
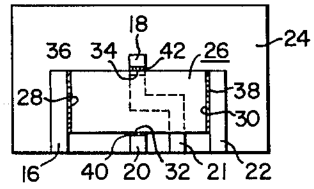
FIG. 4 is a top view of a Hall generator mounted upon a printed circuit board in accordance with the teachings of this invention.

With reference to FIG. 4, the thin slice of semiconductive material 26 is disposed upon surface 24 of printed circuit board 110 between terminals 16, 18, 20 and 22. Edges 28 and 30 of the slice of semiconductive material 26 are bonded to terminals 16 and 22 respectively by solder joints 36 and 38 respectively. Edge 32 of slice 26 is bonded to contact 20 by solder joint 40. Edge 34 of slice 26 is bonded integrally to edge 19 of terminal 18. It will be noted that, as shown in FIG. 4, contacts 16 and 22 are in contact with wafer 26 along the entire length of edges 28 and 30 respectively. It will be further noted that contacts 18 and 20 are in contact with wafer 26 at substantially the midpoint of edges 34 and 20 respectively. Contacts 18 and 20 are exactly opposite each other. The portion 21 of terminal 18 passes under the slice 26. Slice 26 is insulated from portion 21. To ensure the electrical insulation of slice 26 from portion 21 of terminal 18, the portion 21 of the terminal 18 or the bottom surface of slice 26 may be coated with an electrically insulating varnish, for example, a silicone or epoxy resin varnish. If portion 21 is indented into surface 24, no separate insulation need be provided.

Examples of solders which may be used to bond contacts 16, 18, 20 and 22 to slice 26 include the following in which all percentages are by weight: 67% lead—33% tin; 50% lead—50% tin; 90% lead—10% antimony; 82% lead—15% antimony—3% tin; 78% tin—9% aluminum—8% zinc—5% cadmium; 67% tin—33% lead; 67% tin—32% lead—1% indium; and 55% gold—32% silver—13% copper.

Leads, for example, wire conductors may be soldered to the terminals 16, 18, 20 and 22 at the side of board 12 at which they all terminate to facilitate connecting the Hall generator device into an electric circuit.

Figure 5:
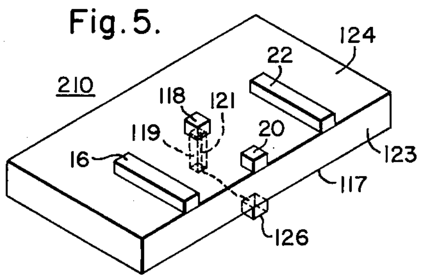
FIG. 5 is a view in perspective of a modified printed circuit member prepared in accordance with the teachings of this invention.

With reference to FIG. 5, in one modification of the present invention, a printed circuit board 210 is prepared with terminals 16, 20 and 22 produced similar to that described above. A passageway 119 is provided to extend from top surface 124 of the board to the bottom surface 117. A secondary contact 118 is disposed upon surface 124 over the passageway 119. An electrical lead 121 is affixed to contact 118, passes through passageway 119 and along the opposite surface 117 to end at 126 on side 123 of the board 210. Flat or rectangular wire may be threaded through passageway 119, an end bent to form terminal 118, and the other end passed along surface 117. A wafer of semiconductor is soldered to terminals 16, 20, 22 and 118 in the manner shown in FIG. 4. In this modification, the contact 118 is insulated from the slice of semiconductor material by the board itself.

In addition to preparing Hall-generator type semiconductive devices, the teachings of this invention are also applicable to preparing other similar semiconductor devices, for example, an Ettinghauser effect device, a magneto-resistor device and a Corbino disk device.

Figure 6:
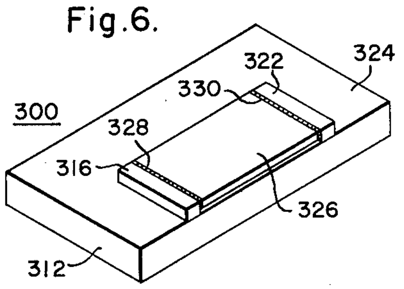
FIG. 6 is a view in perspective of a magneto-resistor device prepared in accordance with the teachings of this invention.

With reference to FIG. 6, there is illustrated a magneto-resistor device 300 prepared in accordance with a modification of the teachings of this invention. The device 300 is comprised of an insulating sheet 312 and two electrical contacts 316 and 322 disposed upon surface 324 of sheet 312 in the manner described above or by any other means of preparing a printed circuit board known to those skilled in the art. A slice 326 of a semiconductive material is disposed upon surface 324 of sheet 312 and soldered to contacts 316 and 322 along edges 328 and 330.

The devices of FIGURES 4, 5 and 6 are encapsulated or coated with a protective exterior coating of material, as for example, a coating of an epoxy resin or a siloxane varnish. The resin may be applied by dipping and then cured by heating. This results in a simple and low cost device.

The following example is illustrative of the practice of this invention.

*Example I*

An epoxy resin glass cloth board laminate having a layer of copper disposed upon one surface thereof was used to prepare the Hall generator.

The board was 0.375 inch by 0.312 inch and was comprised of a sheet of glass cloth impregnated with a fully cured epoxy resin, and had a thickness of 0.008 inch and a layer of copper foil having a thickness of 0.001 inch adhesively bonded to the board.

The copper surface was cleaned and dried. A photo resist emulsion was sprayed on the surface of the clean copper and dried in place.

A photographic negative of the electrical circuit pattern (similar to that shown in FIG. 1) was disposed upon the applied resist emulsion on the copper. The negative was then exposed to an arc light to harden the photo resist coating at the areas corresponding to the desired circuit. The board was then dipped in a solvent to remove the unexposed and unhardened portion of the photo resist emulsion from the copper surface. The copper-epoxy board with the resist on selected portions was then immersed in ferric chloride solution to etch away the copper not covered by the resist. After the etching was completed, the board was removed from the ferric chloride solution and the resist removed from that portion 21 of the copper lead that will pass under the slice of semiconductive material. The board was then returned to the ferric chloride bath for additional etching. The etching was continued until it removed all of the copper outside the desired circuit area and about half of the thickness of portion 19. A 40° Baumé ferric chloride solution at 125° F. will etch approximately 0.0007 inch of copper per minute.

After the etching was completed the board was removed from the ferric chloride solution, washed, and the resist removed from the remainder of the copper circuit terminals. The resulting product was an insulating board with an electrical circuit pattern in copper disposed upon one surface thereof (similar to that shown in FIG. 2).

A diamond cut saw was used to cut a slice of indium arsenide 0.270 inch long, 0.120 inch wide and 0.006 inch thick from an elongated body of indium arsenide of rectangular cross-section.

The surfaces of the slice were polished with an etchant comprised of 39.2%, by weight concentrated $HNO_3$, 33.0%, by weight concentrated HCl, and 27.8%, by weight, $H_2O$.

The etched slice of indium arsenide was disposed between the terminals of the printed circuit board.

The portion 21 of the terminal that passes under the indium arsenide slice was coated with a dimethyl silicone varnish prior to the soldering of the slice to the contacts.

The indium arsenide slice was soldered to the various terminals as shown in FIGURE 4, with a solder comprised of 67% lead and 33% tin. The resultant structure was similar to that shown in FIG. 4.

The device of this example was tested for electrical and semiconductor properties and found to be satisfactory. The device was found to have a Hall voltage of 100 mv. and a null voltage of 1.2 mv. with a control current of 0.3 ampere and a 6 kilogauss magnetic field.

While the invention has been described with reference to particular embodiments and examples, it will be understood that modifications, substitutions and the like may be made therein without departing from its scope.

We claim as our invention:

1. A Hall generator comprising a printed circuit board, said printed circuit board having electrical contacts comprising metal attached thereto and in a predetermined position on the board to form primary and secondary contacts, a thin rectangular wafer of a semiconductive material, the primary contacts soldered to one pair of opposite edges of the wafer, the secondary contacts soldered to the other pair of opposite edges of the wafer on a line at right angles to the line of primary contacts, and a coating of a fully cured resin disposed entirely about the contacts and wafer.

2. A Hall generator comprising a printed circuit board, said printed circuit board having four electrical metal contacts attached to one surface thereof at predetermined positions, two of said contacts being primary contacts and the other two contacts being secondary contacts, a thin rectangular wafer of a semiconductor material disposed upon said board between said contacts, the primary contacts soldered to one pair of opposite edges of the wafer along the entire length of the edges, the secondary contacts soldered to the other pair of opposite edges at substantially the midpoint of the edge, said secondary contacts being directly opposite each other, and a coating of a fully cured resin disposed entirely about the contacts and the wafer.

3. A Hall generator comprising a printed circuit board, said printed circuit board having four electrical metal contacts attached to one surface thereof at predetermined positions, two of said contacts being primary contacts and the other two contacts being secondary contacts, a thin rectangular wafer of a semiconductive material disposed upon said surface of the board between said contacts, said wafer having a top and a bottom surface, said bottom surface of the wafer being immediately adjacent to the surface of the board, said bottom surface of the wafer being coated with an electrical insulating varnish, the primary contacts soldered to one pair of opposite edges of the wafer along the entire length of the edge, the secondary contacts soldered to the other pair of opposite edges at substantially the midpoint of the edge, said secondary contacts being directly opposite each other, and a coating of a fully cured resin disposed entirely about the contacts and the wafer.

4. A Hall generator comprising a printed circuit board, said printed circuit board having four electrical metal contacts attached to one surface thereof at predetermined positions and terminating at one edge of said board, two of said contacts being primary contacts and the other two contacts being secondary contacts, a thin rectangular wafer of a semiconductive material disposed upon the surface of the board between said contacts, a portion of at least one of said contacts passing under said wafer, said portion of said contact being coated with an electrical insulating varnish, the primary contacts soldered to one pair of opposite edges along the entire length of the edge, the secondary contacts soldered to the other pair of opposite edges at substantially the midpoint of the edge, said secondary contacts being directly opposite each other, and a coating of a fully cured resin disposed entirely about the contacts and wafer.

References Cited in the file of this patent

UNITED STATES PATENTS

| | | |
|---|---|---|
| 2,486,110 | Bugel et al. | Oct. 25, 1949 |
| 2,498,890 | Kotterman | Feb. 28, 1950 |
| 2,562,120 | Pearson | July 24, 1951 |
| 2,817,046 | Weiss | Dec. 17, 1957 |
| 2,877,394 | Kuhrt | Mar. 10, 1959 |
| 2,914,728 | Brophy et al. | Nov. 24, 1959 |